United States Patent
Hitomi et al.

(10) Patent No.: US 10,128,796 B2
(45) Date of Patent: Nov. 13, 2018

(54) POWER AMPLIFICATION MODULE AND FRONT END CIRCUIT

(71) Applicant: Murata Manufacturing Co., Ltd., Kyoto (JP)

(72) Inventors: Shinya Hitomi, Kyoto (JP); Hidenori Obiya, Kyoto (JP); Tsuyoshi Sato, Kyoto (JP); Shingo Yanagihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/977,814

(22) Filed: Dec. 22, 2015

(65) Prior Publication Data

US 2016/0112009 A1    Apr. 21, 2016

Related U.S. Application Data

(63) Continuation of application No. PCT/JP2014/067328, filed on Jun. 30, 2014.

(30) Foreign Application Priority Data

Jul. 1, 2013 (JP) ................................ 2013-137675
Apr. 9, 2014 (WO) .................. PCT/JP2014/060248

(51) Int. Cl.
*H03F 1/02* (2006.01)
*H04B 1/525* (2015.01)
(Continued)

(52) U.S. Cl.
CPC ............ *H03F 1/0205* (2013.01); *H03F 1/565* (2013.01); *H03F 3/19* (2013.01); *H03F 3/211* (2013.01);
(Continued)

(58) Field of Classification Search
CPC ..... H03F 3/211; H03F 3/2178; H04B 1/0458; H04B 2001/0408
(Continued)

(56) References Cited

U.S. PATENT DOCUMENTS 4,422,047 A * 12/1983 Wright ..................... H03G 5/24
330/279
6,144,260 A * 11/2000 Hashimoto ............. H03F 3/191
330/306
(Continued)

FOREIGN PATENT DOCUMENTS

JP    H08-335831 A    12/1996
JP    2000-115016 A    4/2000
(Continued)

OTHER PUBLICATIONS

International Search Report issued in Application No. PCT/JP2014/060248 dated Jul. 8, 2014.
(Continued)

*Primary Examiner* — Simon Nguyen
(74) *Attorney, Agent, or Firm* — Pearne & Gordon LLP

(57) ABSTRACT

A PA module (10) includes multiple amplifying elements (11a, 11b) and a variable filter circuit (12). The amplifying elements (11a, 11b) amplify a transmission signal in a frequency range including multiple communication bands and are cascade-connected to each other. The variable filter circuit (12) is connected between the amplifying elements (11a, 11b). The variable filter circuit (12) uses a transmission band corresponding to a used communication band selected from the multiple communication bands as a pass band and a reception band corresponding to the used communication band as an attenuation band.

19 Claims, 6 Drawing Sheets

(51) Int. Cl.
*H03F 1/56* (2006.01)
*H03F 3/21* (2006.01)
*H04B 1/04* (2006.01)
*H03F 3/19* (2006.01)
*H03F 3/24* (2006.01)
*H03H 7/38* (2006.01)

(52) U.S. Cl.
CPC ............... *H03F 3/245* (2013.01); *H03H 7/38* (2013.01); *H04B 1/04* (2013.01); *H04B 1/525* (2013.01); *H03F 2200/111* (2013.01); *H03F 2200/318* (2013.01); *H03F 2200/411* (2013.01); *H03F 2203/21139* (2013.01); *H04B 2001/0416* (2013.01)

(58) Field of Classification Search
USPC ............. 455/125, 127.3, 127.4, 552.1–553.1
See application file for complete search history.

(56) References Cited

U.S. PATENT DOCUMENTS

| | | | |
|---|---|---|---|
| 6,489,862 B1 | 12/2002 | Frank | |
| 7,863,983 B2* | 1/2011 | Yuen | H03F 1/0216 330/133 |
| 8,213,537 B2* | 7/2012 | Youtz | H04B 1/30 375/297 |
| 2004/0008082 A1* | 1/2004 | Dow | H03F 1/14 330/51 |
| 2007/0218844 A1* | 9/2007 | Alanen | H03H 19/008 455/73 |
| 2010/0308933 A1* | 12/2010 | See | H03F 1/565 333/32 |
| 2011/0065472 A1* | 3/2011 | Zhu | H03F 1/56 455/552.1 |
| 2011/0269416 A1* | 11/2011 | Kadoi | H04B 1/0458 455/127.2 |
| 2011/0304388 A1* | 12/2011 | Yamawaki | H04B 1/006 327/557 |
| 2012/0286876 A1* | 11/2012 | Lee | H03F 3/72 330/295 |
| 2013/0130750 A1* | 5/2013 | Chang | H03F 3/19 455/571 |
| 2013/0316663 A1* | 11/2013 | Kishigami | H03H 7/40 455/78 |
| 2014/0378188 A1* | 12/2014 | Liu | H04W 52/0261 455/574 |
| 2015/0119115 A1* | 4/2015 | Bagger | H04B 1/0057 455/571 |

FOREIGN PATENT DOCUMENTS

| | | |
|---|---|---|
| JP | 2002-185262 A | 6/2002 |
| JP | 2004-194097 A | 7/2004 |
| JP | 2007-060455 A | 3/2007 |
| JP | 2011-182271 A | 9/2011 |
| JP | 2013-110619 A | 6/2013 |

OTHER PUBLICATIONS

Written Opinion issued in Application No. PCT/JP2014/060248 dated Jul. 8, 2014.
International Search Report issued in Application No. PCT/JP2014/067328 dated Jul. 29, 2014.
Translation of Written Opinion issued in Application No. PCT/JP2014/067328 dated Jul. 29, 2014.

* cited by examiner

POWER AMPLIFICATION MODULE AND FRONT END CIRCUIT

BACKGROUND OF THE DISCLOSURE

Field of the Disclosure

The present disclosure relates to a power amplification module that amplifies a transmission signal and a front end circuit including the power amplification module.

Description of the Related Art

Front end circuits in related art are disclosed in, for example, Patent Document 1. The front end circuit described in Patent Document 1 includes a wide-band power amplifier, a band switch, and duplexers. The wide-band power amplifier is a multimode-multiband power amplifier. The multiple duplexers are provided for the respective communication bands. The wide-band power amplifier is connected to the duplexers with the band switch interposed therebetween.

In transmission in a certain communication band, a transmission signal amplified by the wide-band power amplifier is supplied to the duplexer corresponding to the communication band through the band switch. The duplexer causes the transmission signal to be transmitted to an antenna side and prevents the transmission signal from entering a reception circuit side. The front end circuit described in Patent Document 1 is capable of transmitting and receiving high-frequency signals in multiple communication bands in the above manner.

Patent Document 1: Japanese Unexamined Patent Application Publication No. 2011-182271

BRIEF SUMMARY OF THE DISCLOSURE

In general, in amplification of a transmission signal with a power amplifier, heat is generated and harmonic distortion occurs to generate noise. This noise includes reception band noise having a frequency within a reception band. The reception band noise that enters the reception circuit side degrades receiving sensitivity.

In the front end circuit described in Patent Document 1, the reception band noise occurring in the wide-band power amplifier is attenuated with the duplexers. However, when the reception band noise is intended to be sufficiently attenuated with the duplexers, the transmission signal may possibly be attenuated more than necessary.

It is an object of the present disclosure to provide a power amplification module capable of realizing excellent communication characteristics in a frequency range including multiple communication bands and a front end circuit including the power amplification module.

The present disclosure provides a power amplification module including multiple amplifying elements and a variable filter circuit. The amplifying elements amplify a transmission signal in a frequency range including multiple communication bands and are cascade-connected to each other. The variable filter circuit is connected between the amplifying elements. The variable filter circuit uses a transmission band corresponding to a used communication band selected from the multiple communication bands as a pass band and a reception band corresponding to the used communication band as an attenuation band.

With the above configuration, the variable filter circuit uses the transmission band as the pass band and the reception band corresponding to the transmission band as the attenuation band in the frequency range including the multiple communication bands. Accordingly, the variable filter circuit attenuates reception band noise that has occurred in the amplification of the transmission signal in an anterior amplifying element. As a result, since the level of the reception band noise entering the reception circuit side is suppressed, degradation of receiving sensitivity is reduced. In other words, the degradation of the receiving sensitivity is prevented without greatly attenuating the transmission signal in the frequency range including the multiple communication bands. Accordingly, it is possible to realize excellent communication characteristics in the frequency range including the multiple communication bands.

In addition, the variable filter circuit attenuates the reception band noise that has occurred in the amplification of the transmission signal in the anterior amplifying element, as described above. Accordingly, since the amplification of the reception band noise by a posterior amplifying element is suppressed, it is possible to reduce power loss.

In the power amplification module of the present disclosure, the variable filter circuit may include multiple filter components and a switch circuit that switches between the filter components.

In the power amplification module of the present disclosure, the attenuation band of the variable filter circuit may be continuously varied.

In the power amplification module of the present disclosure, the variable filter circuit may be a band pass filter.

In the power amplification module of the present disclosure, the variable filter circuit may be a band elimination filter. With this configuration, since the size of the variable filter circuit is decreased, compared with the case in which the variable filter circuit is a band pass filter, it is possible to easily design the power amplification module.

In the power amplification module of the present disclosure, the variable filter circuit preferably uses only a transmission modulation band that is used, in the transmission band, as the pass band. With this configuration, the pass band of the variable filter circuit is narrowed down not in accordance with the entire transmission band that is used but in accordance with the transmission modulation band that is used. This improves bandpass characteristics of the variable filter circuit and increases the effect of attenuating the reception band noise.

The power amplification module of the present disclosure is preferably configured in the following manner. The power amplification module of the present disclosure includes at least one matching circuit that performs matching in the frequency range including the multiple communication bands. The amplifying elements include a first amplifying element and a second amplifying element. An output terminal of the first amplifying element is connected to an input terminal of the variable filter circuit. An input terminal of the second amplifying element is connected to an output terminal of the variable filter circuit. The matching circuit is connected at least one of between the output terminal of the first amplifying element and the input terminal of the variable filter circuit and between the input terminal of the second amplifying element and the output terminal of the variable filter circuit.

With the above configuration, even if the impedance of the variable filter circuit is varied depending on the used communication band, the matching between the first amplifying element side or the second amplifying element side and the variable filter circuit side is available. Accordingly, it is possible to suppress degradation in output characteristics in the transmission band of the power amplification module, which is caused by the variation in impedance of the variable filter circuit, in the wide frequency range including the multiple communication bands.

In the power amplification module of the present disclosure, the matching circuit is preferably connected between the output terminal of the first amplifying element and the variable filter circuit and between the input terminal of the second amplifying element and the variable filter circuit.

In the power amplification module of the present disclosure, the matching circuit is preferably connected to an input terminal side of the first amplifying element and an output terminal side of the second amplifying element.

In the power amplification module of the present disclosure, the matching circuit may include at least one variable reactance. With this configuration, varying the variable reactance in accordance with the frequency of the high-frequency signal that is used allows the matching in the wide frequency range to be performed.

In the power amplification module of the present disclosure, the variable reactance may be a variable capacitance element.

In the power amplification module of the present disclosure, the variable reactance may include multiple reactances the values of which are not varied and a switch circuit that switches between the reactances.

In the power amplification module of the present disclosure, the matching circuit may perform temperature compensation by varying the variable reactance on the basis of a result of measurement by a temperature sensor. With this configuration, the matching is available even if the impedance of the amplifying element or the variable filter circuit is varied due to temperature change.

In the power amplification module of the present disclosure, the matching circuit may be configured by cascade-connecting a circuit composed of a reactance connected in series and a reactance connected in parallel. With this configuration, it is possible to realize the matching circuit that performs the matching in the wide frequency range without using the variable reactance. In other words, it is not necessary to control the variable reactance for the matching.

The present disclosure provides a front end circuit including a circulator, an antenna, a reception circuit, and a transmission circuit. The circulator includes a first terminal, a second terminal, and a third terminal. The antenna is connected to the first terminal. The reception circuit is connected to the second terminal. The transmission circuit is connected to the third terminal and includes the power amplification module of the present disclosure. The circulator supplies a high-frequency signal input into the first terminal to the second terminal and supplies a high-frequency signal input into the third terminal to the first terminal in the frequency range including the multiple communication bands.

With the above configuration, the circulator supports the frequency range including the multiple communication bands. In addition, the circulator is smaller than the multiple duplexers provided for respective communication bands. Since the reception band noise output from the power amplification module is small, the level of the reception band noise entering the second terminal of the circulator from the third terminal thereof is suppressed. Accordingly, high isolation is ensured between transmission and reception even when the circulator is used to demultiplex the transmission signal from the reception signal. Consequently, it is possible to realize the compact front end circuit having excellent communication characteristics in the multiple communication bands.

According to the present disclosure, it is possible to realize excellent communication characteristics in a frequency range including multiple communication bands.

DETAILED DESCRIPTION OF THE DISCLOSURE

<<First Embodiment>>

Figure 1:
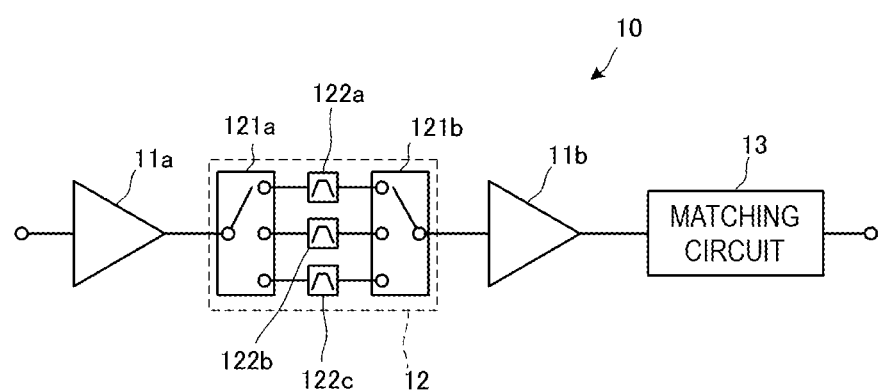
FIG. 1 is a diagram illustrating the configuration of a PA module 10 according to a first embodiment.

A power amplifier (PA) module 10 according to a first embodiment of the present disclosure will now be described. The PA module 10 corresponds to a power amplification module of the present disclosure. FIG. 1 is a diagram illustrating the configuration of the PA module 10. The PA module 10 includes amplifying elements 11a and 11b, a variable filter circuit 12, and a matching circuit 13. An input terminal of the amplifying element 11a is connected to an input terminal of the PA module 10. An output terminal of the amplifying element 11a is connected to an input terminal of the variable filter circuit 12. An output terminal of the variable filter circuit 12 is connected to an input terminal of the amplifying element 11b. An output terminal of the amplifying element 11b is connected to an output terminal of the PA module 10 with the matching circuit 13 interposed therebetween.

Each of the amplifying elements 11a and 11b is a multi-mode-multiband power amplifier capable of being used in multiple communication methods and multiple communication bands. The amplifying elements 11a and 11b are formed in, for example, one power amplifier integrated circuit (PAIC). The amplifying element 11a is a first-stage amplifying element and the amplifying element 11b is a last-stage amplifying element.

The variable filter circuit 12 is arranged close to, for example, the PAIC and is connected to the PAIC using wire boding or the like. The variable filter circuit 12 includes, for example, a surface acoustic wave (SAW) resonator or a bulk acoustic wave (BAW) resonator.

The variable filter circuit 12 includes switch circuits 121a and 121b and filter components 122a to 122c. Each of the switch circuits 121a and 121b has a common terminal and first to third individual terminals. The common terminal is connected to either of the first to third individual terminals in response to a control signal. Each of the filter components 122a to 122c is a band pass filter. The filter components 122a to 122c have different pass band characteristics, and the pass band characteristics of each of the filter components 122a to 122c are set in accordance with the communication band that is used.

Forming the filter components 122a to 122c of SAW filters or the like makes attenuation characteristics of the filter components 122a to 122c steep. Accordingly, only high-frequency signals in a communication band through which the high-frequency signals are desirably transmitted are capable of being transmitted with low loss. In other words, it is possible to transmit only the high-frequency signals in the communication band through which the high-frequency signals are desirably transmitted and to greatly attenuate high-frequency signals in the other communication bands.

Each of the filter components may be a band elimination filter. Since the size of the band elimination filter may be made smaller than that of the band pass filter, the variable filter circuit 12 and the PA module 10 are capable of being easily designed.

The common terminal of the switch circuit 121a is connected to the output terminal of the amplifying element 11a. The first individual terminal of the switch circuit 121a is connected to the first individual terminal of the switch circuit 121b with the filter component 122a interposed therebetween. The second individual terminal of the switch circuit 121a is connected to the second individual terminal of the switch circuit 121b with the filter component 122b interposed therebetween. The third individual terminal of the switch circuit 121a is connected to the third individual terminal of the switch circuit 121b with the filter component 122c interposed therebetween. The common terminal of the switch circuit 121b is connected to the input terminal of the amplifying element 11b.

The switch circuits 121a and 121b in the variable filter circuit 12 each switch a signal path in accordance with the communication method or the communication band. Accordingly, the variable filter circuit 12 switches a pass band or an attenuation band in accordance with the communication method or the communication band. In other words, the variable filter circuit 12 functions as a selectable filter.

The variable filter circuit may be, for example, a tunable filter capable of continuously varying the pass band or the attenuation band.

A transmission signal input into the PA module 10 is amplified by the amplifying element 11a. The amplified transmission signal is supplied to the variable filter circuit 12. The transmission signal supplied to the variable filter circuit 12 passes through the filter component matched with the communication method and the communication band. The transmission signal that has passed through the variable filter circuit 12 is further amplified by the amplifying element 11b and is output from the PA module 10.

Figure 2:
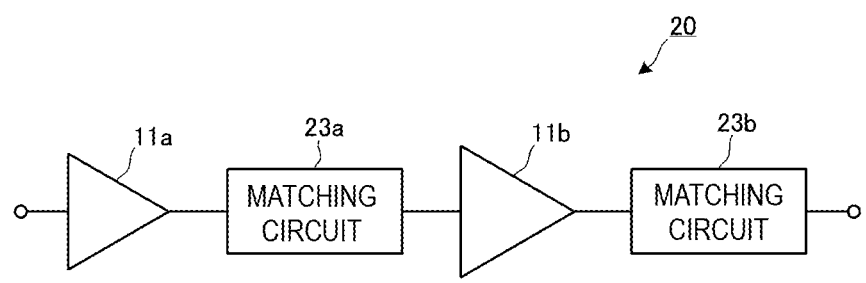
FIG. 2 is a diagram illustrating the configuration of a PA module 20 in the related art.

A PA module 20 having a configuration in the related art will now be described for comparison with the PA module 10. FIG. 2 is a diagram illustrating the configuration of the PA module 20. The PA module 20 includes the amplifying elements 11a and 11b and matching circuits 23a and 23b.

The input terminal of the amplifying element 11a is connected to the input terminal of the PA module 20. The output terminal of the amplifying element 11a is connected to the input terminal of the amplifying element 11b with the matching circuit 23a interposed therebetween. The output terminal of the amplifying element 11b is connected to the output terminal of the PA module 20 with the matching circuit 23b interposed therebetween.

Figure 3A:
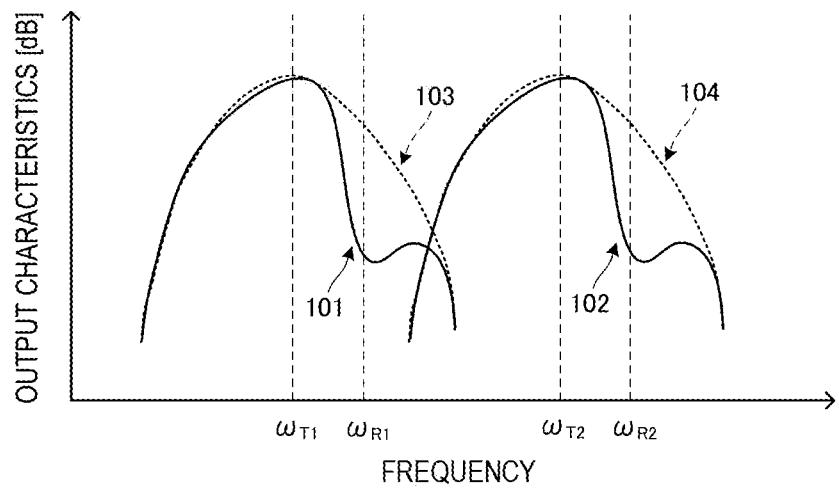
FIG. 3A illustrates output characteristics of the PA modules and FIG. 3B is a diagram for describing communication bands.

FIG. 3A illustrates output characteristics of the PA modules. A solid line 101 indicates the output characteristics of the PA module 10 when a communication band $B_1$ is selected. A solid line 102 indicates the output characteristics of the PA module 10 when a communication band $B_2$ is selected. A broken line 103 indicates the output characteristics of the PA module 20 when the communication band $B_1$ is selected. A broken line 104 indicates the output characteristics of the PA module 20 when the communication band $B_2$ is selected. For example, the communication band $B_1$ is an 800-MHz band and the communication band $B_2$ is a 1-GHz band.

Figure 3B:
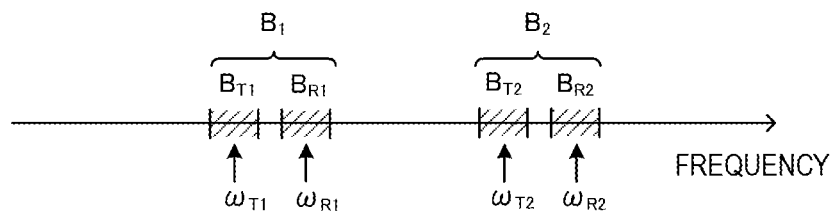

As illustrated in FIG. 3B, a transmission frequency $\omega_{T1}$ indicates the center frequency of a transmission band $B_{T1}$ corresponding to the communication band $B_1$. A reception frequency $\omega_{R1}$ indicates the center frequency of a reception band $B_{R1}$ corresponding to the communication band $B_1$. A transmission frequency $\omega_{T2}$ indicates the center frequency of a transmission band $B_{T2}$ corresponding to the communication band $B_2$. A reception frequency $\omega_{R2}$ indicates the center frequency of a reception band $B_{R2}$ corresponding to the communication band $B_2$.

When the communication band $B_1$ is selected as a used communication band, in the PA module 10, the signal level of an output signal is increased in the transmission band $B_{T1}$ while the signal level of the output signal is greatly attenuated in the reception band $B_{R1}$. In the PA module 20 in the related art, the signal level of the output signal is increased in the transmission band $B_{T1}$, as in the PA module 10, while the signal level of the output signal is not attenuated so much in the reception band $B_{R1}$.

Similarly, when the communication band $B_2$ is selected as the used communication band, in the PA module 10, the signal level of the output signal is increased in the transmission band $B_{T2}$ while the signal level of the output signal is greatly attenuated in the reception band $B_{R2}$. In the PA module 20 in the related art, the signal level of the output signal is increased in the transmission band $B_{T2}$, as in the PA module 10, while the signal level of the output signal is not attenuated so much in the reception band $B_{R2}$.

For example, the filter component 122a uses the transmission band $B_{T1}$ as the pass band and the reception band $B_{R1}$ as the attenuation band. The filter component 122b uses the transmission band $B_{T2}$ as the pass band and the reception band $B_{R2}$ as the attenuation band. When the communication band $B_1$ is selected as the used communication band, the transmission signal passes through the filter component 122a. When the communication band $B_2$ is selected as the used communication band, the transmission signal passes through the filter component 122b. Accordingly, the variable filter circuit 12 and the PA module 10 have the output characteristics illustrated in FIG. 3A.

In the first embodiment, the variable filter circuit 12 uses the transmission band as the pass band and uses the reception band corresponding to the transmission band as the attenuation band in a frequency range including multiple communication bands. Accordingly, the variable filter circuit 12 attenuates reception band noise that has occurred in the amplification of the transmission signal by the first-stage amplifying element 11a. As a result, since the level of the reception band noise entering the reception circuit side is suppressed, degradation of receiving sensitivity is reduced. In addition, as described above, since the transmission band is used as the pass band and the reception band corresponding to the transmission band is used as the attenuation band, the transmission signal is not attenuated so much. In other words, the degradation of the receiving sensitivity is prevented without greatly attenuating the transmission signal in the frequency range including the multiple communication bands. Accordingly, excellent communication characteristics are realized in the frequency range including the multiple communication bands in the PA module 10.

In the PA module 20 in the related art, the reception band noise that has occurred in the amplification of the transmission signal by the amplifying element 11a is amplified by the amplifying element 11b. In contrast, in the PA module 10 of the first embodiment, the reception band noise that has occurred in the amplification of the transmission signal by the amplifying element 11a is attenuated by the variable filter circuit 12. Accordingly, the amplification of the reception band noise by the amplifying element 11b is suppressed. As a result, power loss is reduced in the PA module 10, compared with that in the PA module 20.

Although the PA module including the two amplifying elements is described in the first embodiment, a PA module including three or more amplifying elements may be used. Also in this configuration, the provision of the variable filter circuit between the amplifying elements allows the level of the reception band noise occurring in the transmission to be reduced, as in the first embodiment. In this case, provision of the variable filter circuit between the final-stage amplifying element and an anterior amplifying element connected next to the final-stage amplifying element most improves the effect of reducing the reception band noise.

<<Second Embodiment>>

Figure 4:
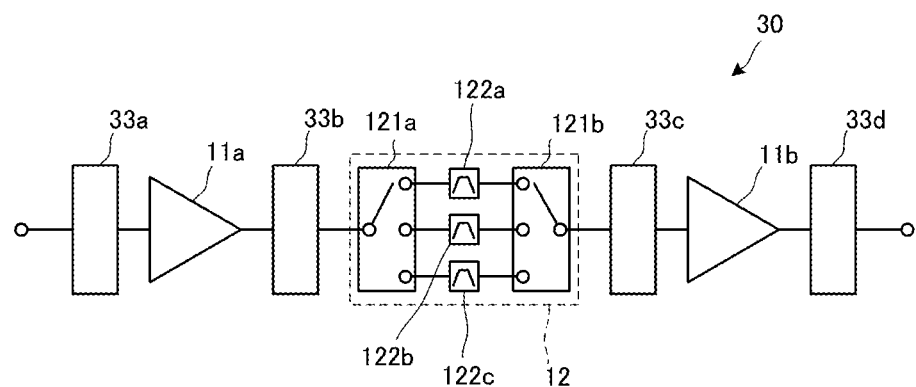
FIG. 4 is a diagram illustrating the configuration of a PA module 30 according to a second embodiment.

A PA module 30 according to a second embodiment of the present disclosure will now be described. FIG. 4 is a diagram illustrating the configuration of the PA module 30. A wide-band matching circuit 33a is connected between an input terminal of the PA module 30 and the input terminal of the amplifying element 11a. A wide-band matching circuit 33b is connected between the output terminal of the amplifying element 11a and the input terminal of the variable filter circuit 12. A wide-band matching circuit 33c is connected between the output terminal of the variable filter circuit 12 and the input terminal of the amplifying element 11b. A wide-band matching circuit 33d is connected between the output terminal of the amplifying element 11b and an output terminal of the PA module 30. A temperature sensor (not illustrated) is provided near the PA module 30. The temperature sensor is used to correct the changes in impedance of the amplifying elements 11a and 11b and the variable filter circuit 12, which are caused by temperature change. The amplifying element 11a corresponds to a first amplifying element of the present disclosure. The amplifying element 11b corresponds to a second amplifying element of the present disclosure. Each of the wide-band matching circuits 33a to 33d corresponds to "a matching circuit" of the present disclosure.

The wide-band matching circuit 33a performs matching between the input terminal side of the PA module 30 and the amplifying element 11a side in the wide frequency range including the multiple communication bands. The wide-band matching circuit 33b performs matching between the amplifying element 11a side and the variable filter circuit 12 side in the wide frequency range including the multiple communication bands. The wide-band matching circuit 33c performs matching between the variable filter circuit 12 side and the amplifying element 11b side in the wide frequency range including the multiple communication bands. The wide-band matching circuit 33d performs matching between the amplifying element 11b side and the output terminal side of the PA module in the wide frequency range including the multiple communication bands.

Figure 5A:
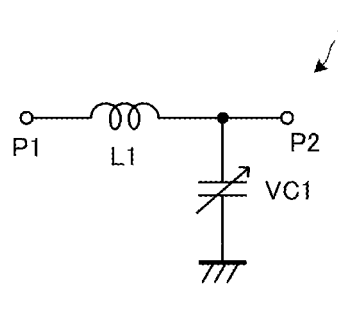
FIGS. 5A to 5C include circuit diagrams illustrating specific examples of wide-band matching circuits 33a to 33d.
Figure 5B:
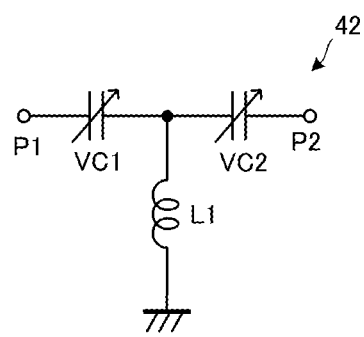
Figure 5C:
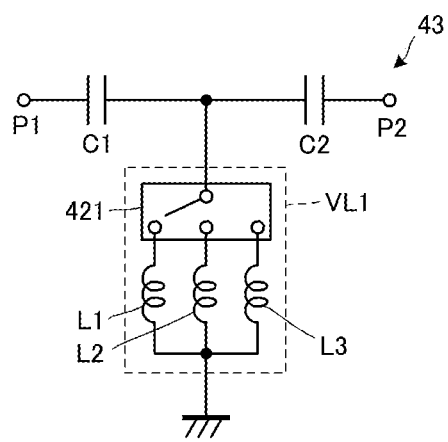

FIGS. 5A to 5C include circuit diagrams illustrating specific examples of the wide-band matching circuits 33a to 33d. In a wide-band matching circuit 41, as illustrated in FIG. 5A, an inductor L1 is connected between a terminal P1 and a terminal P2. A node between the inductor L1 and the terminal P2 is grounded with a variable capacitance element VC1 interposed therebetween. In a wide-band matching circuit 42, as illustrated in FIG. 5B, variable capacitance elements VC1 and VC2 are connected in series between the terminal P1 and the terminal P2. A node between the variable capacitance element VC1 and the variable capacitance element VC2 is grounded with the inductor L1 interposed therebetween. Each of the variable capacitance elements VC1 and VC2 is, for example, a digital tunable capacitor (DTC), a Micro Electro Mechanical Systems (MEMS) variable capacitor, or a barium strontium titanate (BST) thin-film capacitor. The wide-band matching circuits 41 and 42 perform matching in a wide frequency range by varying the capacitances of the variable capacitance elements VC1 and VC2 in accordance with the frequency of a high-frequency signal that is used.

In a wide-band matching circuit 43, as illustrated in FIG. 5C, capacitors C1 and C2 are connected in series between the terminal P1 and the terminal P2. A node between the capacitor C1 and the capacitor C2 is grounded with a variable inductor VL1 interposed therebetween. In the variable inductor VL1, the value of the variable inductor VL1 is varied by switching between inductors L1 to L3 the values of which are not varied with a switch circuit 421. The wide-band matching circuit 43 performs matching in a wide frequency range by varying the value of the variable inductor VL1 in accordance with the frequency of a high-frequency signal that is used.

Each of the variable capacitance elements VC1 and VC2 and the variable inductor VL1 is an example of a variable reactance the reactance of which is varied through control. The wide-band matching circuits 33a to 33d may each include a variable reactance having a configuration different from those of the variable capacitance elements VC1 and VC2 and the variable inductor VL1.

In addition, the variable reactance may be integrally formed on a semiconductor chip with the amplifying elements 11a and 11b. Alternatively, a tunable filter may be used as the variable filter circuit and the variable reactance may be integrally formed on a semiconductor chip with a variable reactance included in the tunable filter. This allows the PA module 30 to be reduced in size.

In the PA module 30, the value of the variable reactance is varied in accordance with the used communication band. Then, the value of the variable reactance is fine-tuned in accordance with a result of measurement supplied from the temperature sensor. This allows the matching to be performed in accordance with the used communication band. In addition, even if the impedance of the amplifying elements 11a and 11b and/or the variable filter circuit 12 is varied due to the temperature change, the matching is available. In other words, the PA module 30 has a temperature compensation function.

Figure 6A:
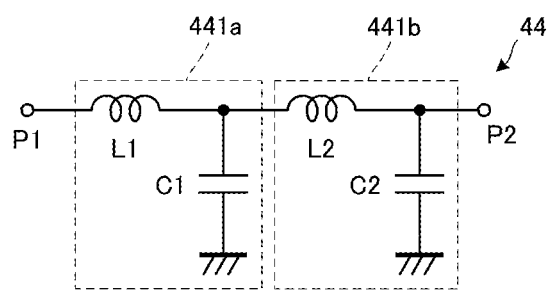
FIGS. 6A and 6B include circuit diagrams illustrating modifications of the wide-band matching circuits 33a to 33d.
Figure 6B:
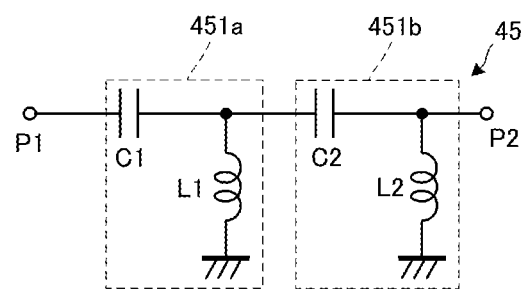

FIGS. 6A and 6B include circuit diagrams illustrating modifications of the wide-band matching circuits 33a to 33d. In a wide-band matching circuit 44, as illustrated in FIG. 6A, LC circuits 441a and 441b are cascade-connected between the terminal P1 and the terminal P2. The LC circuit 441a is composed of the inductor L1 connected in series and the capacitor C1 connected in parallel. The LC circuit 441a functions as a matching circuit by adjusting the values of the inductor L1 and the capacitor C1. The LC circuit 441b includes the inductor L2 and the capacitor C2 and is configured in the same manner as in the LC circuit 441a.

In a wide-band matching circuit 45, as illustrated in FIG. 6B, LC circuits 451a and 451b are cascade-connected between the terminal P1 and the terminal P2. The LC circuit 451a is composed of the capacitor C1 connected in series and the inductor L1 connected in parallel. The LC circuit 451b includes the capacitor C2 and the inductor L2 and is configured in the same manner as in the LC circuit 451a.

Since the LC circuits, which function as the matching circuits by adjusting the values of the inductor and the capacitor, are cascade-connected to each other in each of the wide-band matching circuits 44 and 45, the matching in a wide frequency range is available. In addition, the matching in the wide frequency range is available without using the variable reactance in each of the wide-band matching circuits 44 and 45. In other words, it is not necessary to control the variable reactance for the matching.

The wide-band matching circuits 33a to 33d are not limited to the wide-band matching circuits 41 to 45 and may have any configuration as long as the matching in the wide frequency range including the multiple communication bands is available.

Figure 7A:
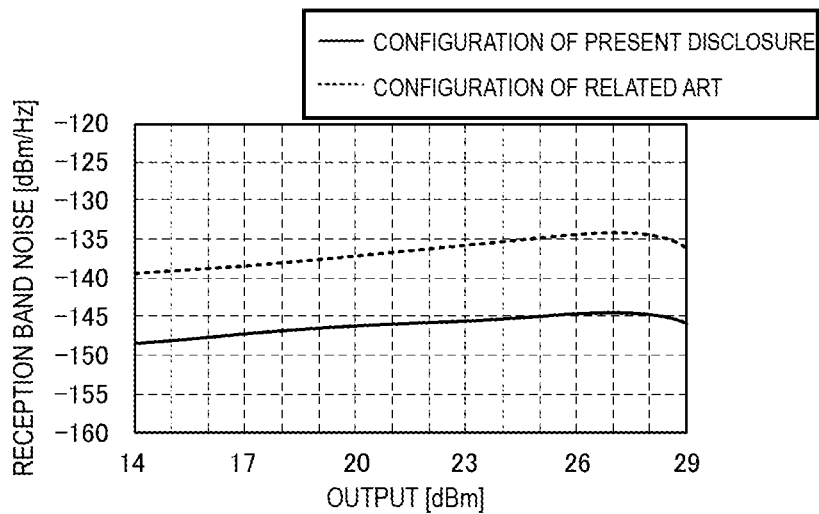
FIG. 7A is a graph illustrating how reception band noise is varied in Band 5 for outputs from the PA modules and FIG. 7B is a graph illustrating how the reception band noise is varied in Band 13 for the outputs from the PA modules.
Figure 7B:
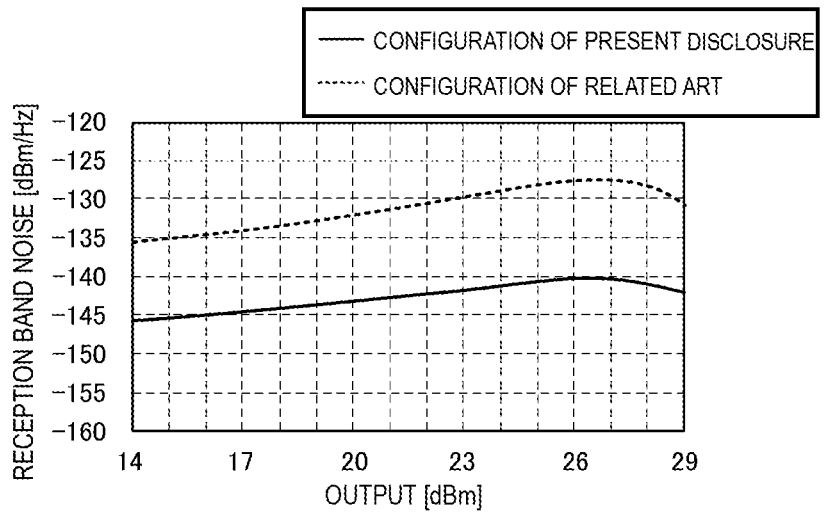
Figure 8:
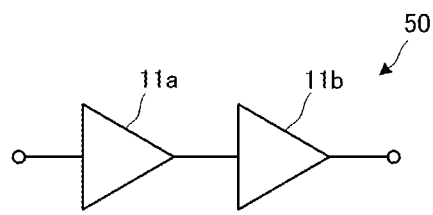
FIG. 8 is a diagram illustrating the configuration of a PA module 50 in the related art.

FIG. 7A is a graph illustrating how the reception band noise is varied in Band 5 for the outputs from the PA modules. FIG. 7B is a graph illustrating how the reception band noise is varied in Band 13 for the outputs from the PA modules. Bands 5 and 13 are defined in Third Generation Partnership Project (3GPP) standard. Solid lines indicate noise characteristics of the PA module 30 having the configuration of the present disclosure and broken lines indicate noise characteristics of a PA module 50 having a configuration in the related art. The PA module 50 includes the amplifying elements 11a and 11b that are cascade-connected to each other, as illustrated in FIG. 8.

As illustrated in FIG. 7A, in Band 5, the reception band noise of the PA module 30 is varied within a range from about −150 dBm/Hz to −145 dBm/Hz and has a maximum value when the output is about 27 dBm. The reception band noise of the PA module 50 is varied within a range from about −140 dBm/Hz to −134 dBm/Hz and has a maximum value when the output is about 27 dBm.

As illustrated in FIG. 7B, in Band 13, the reception band noise of the PA module 30 is varied within a range from about −145 dBm/Hz to −140 dBm/Hz and has a maximum value when the output is about 27 dBm. The reception band noise of the PA module 50 is varied within a range from about −135 dBm/Hz to −127 dBm/Hz and has a maximum value when the output is about 27 dBm.

As described above, in Bans 5 and 13, the PA module 30 has the reception band noise about 10 dBm/Hz lower than that of the PA module 50. In other words, the configuration of the PA module 30 allows the reception band noise to be reduced by about 10 dBm/Hz.

In addition, in the PA module 30, a gain of 28 dB or more, which is required to have as the power amplifier, is known to be achieved in the transmission band corresponding to the used communication band across a wide frequency range from 699 MHz to 915 MHz.

In the second embodiment, the wide-band matching circuit 33b is provided between the amplifying element 11a and the variable filter circuit 12 and the wide-band matching circuit 33c is provided between the variable filter circuit 12 and the amplifying element 11b. Accordingly, even if the impedance of the variable filter circuit 12 is varied depending on the used communication band, the matching between the amplifying element 11a side and the variable filter circuit 12 side and the matching between the variable filter circuit 12 side and the amplifying element 11b side are available. As a result, it is possible to suppress the variation in the output characteristics in the transmission band of the PA module 30, which is caused by the variation in impedance of the variable filter circuit 12, in the wide frequency range including the multiple communication bands. In other words, it is possible to prevent degradation of the output characteristics in the transmission band of the PA module 30, which is caused by mismatching, in the wide frequency range including the multiple communication bands.

The PA module 30 includes the wide-band matching circuits 33a and 33d, in addition to the wide-band matching circuits 33b and 33c. Accordingly, it is possible to further suppress the degradation of the output characteristics in the transmission band of the PA module 30, which is caused by mismatching, in the wide frequency range including the multiple communication bands.

Although the four wide-band matching circuits 33a to 33d are provided in the second embodiment, only one of the wide-band matching circuits 33b and 33c may be provided or only the two wide-band matching circuits 33b and 33c may be provided in the present disclosure. Also in these cases, advantages similar to those of the PA module 30 are achieved to some extent.

<<Third Embodiment>>

A PA module according to a third embodiment of the present disclosure will now be described. The PA module of the third embodiment is similar to the PA module 30 of the second embodiment except for the variable filter circuit 12 (refer to FIG. 4). The variable filter circuit of the third embodiment uses only a transmission modulation band that is used, in the transmission band, as the pass band. The transmission modulation band is included in the transmission band corresponding to the communication band and is a frequency band of a certain width, which is used for transmission. For example, in the 3GPP standard, a channel bandwidth (frequency bandwidth) corresponding to the bandwidth of the transmission modulation band may be selected from 1.4 MHz, 3 MHz, 5 MHz, 10 MHz, 15 MHz, and 20 MHz.

Figure 9:
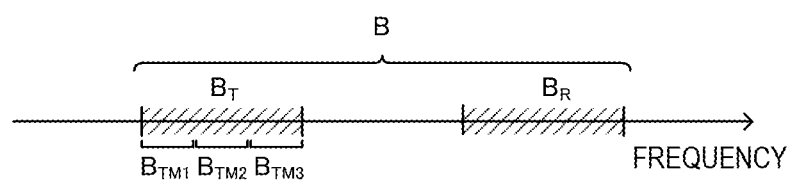
FIG. 9 is a schematic diagram illustrating transmission modulation bands.

FIG. 9 is a schematic diagram illustrating transmission modulation bands. A transmission band $B_T$ and a reception band $B_R$ are defined in a communication band B. The transmission band $B_T$ includes transmission modulation band $B_{TM1}$ to $B_{TM3}$. For example, when the transmission modulation band $B_{TM1}$ is used for transmission, the variable filter circuit uses only the transmission modulation band $B_{TM1}$ as the pass band. When the transmission modulation band $B_{TM2}$ is used for transmission, the variable filter circuit uses only the transmission modulation band $B_{TM2}$ as the pass band.

In the third embodiment, as described above, only the transmission modulation band that is used, in the transmission band, is used as the pass band of the variable filter circuit. Specifically, the pass band of the variable filter circuit is narrowed down not in accordance with the entire transmission band that is used but in accordance with the transmission modulation band that is used. This improves bandpass characteristics of the variable filter circuit and increases the effect of attenuating the reception band noise.

<<Fourth Embodiment>>

Figure 10:
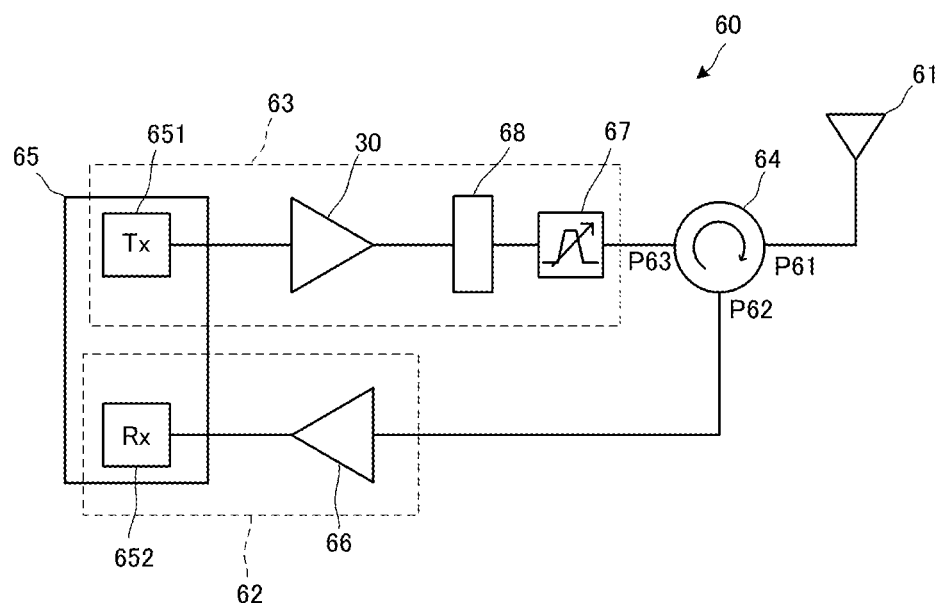
FIG. 10 is a diagram illustrating the configuration of a front end circuit 60 according to a fourth embodiment.

A front end circuit 60 according to a fourth embodiment of the present disclosure will now be described. FIG. 10 is a diagram illustrating the configuration of the front end circuit 60. The front end circuit 60 includes an antenna 61, a reception circuit 62, a transmission circuit 63, and a circulator 64. The reception circuit 62 includes a low noise amplifier 66 and a receiver 652. The transmission circuit 63 includes the PA module 30, a wide-band matching circuit 68, a variable filter circuit 67, and a transmitter 651. The receiver 652 and the transmitter 651 are provided in a radio-frequency integrated circuit (RFIC) 65.

The circulator 64 has terminals P61 to P63. A high-frequency signal input from the terminal P61 is supplied to the terminal P62. A high-frequency signal input from the terminal P63 is supplied to the terminal P61. The circulator 64 transmits the high-frequency signal with low loss in the wide frequency range including the multiple communication bands. For example, a wide-range circulator described in Patent Document (Japanese Unexamined Patent Application Publication No. 6-343005) is capable of being designed.

The terminal P61 corresponds to a first terminal of the present disclosure. The terminal P62 corresponds to a second terminal of the present disclosure. The terminal P63 corresponds to a third terminal of the present disclosure.

The antenna 61 is connected to the terminal P61. An input terminal of the low noise amplifier 66 is connected to the terminal P62. An output terminal of the low noise amplifier 66 is connected to the receiver 651. The output terminal of the PA module 30 is connected to the terminal P63 with the variable filter circuit 67 interposed therebetween. The wide-band matching circuit 68 is connected between the output terminal of the PA module 30 and the variable filter circuit 67. The input terminal of the PA module 30 is connected to the transmitter 651.

The variable filter circuit 67 includes a variable reactance. The bandpass characteristics of the variable filter circuit 67 is controlled by varying the value of the variable reactance in the variable filter circuit 67 and the transmission band corresponding to the used communication band is used as the pass band. This causes the variable filter circuit 67 to attenuate the reception band noise output from the PA module 30. The variable reactance of the variable filter circuit 67 is, for example, a DTC, a MEMS variable capacitor, a BST thin-film capacitor, or a reactance circuit, such as the variable inductor VL1 illustrated in FIG. 5C, including the switch circuit 421. The wide-band matching circuit 68 performs matching between the variable filter circuit 67 side and the PA module 30 side in the wide frequency range including the multiple communication bands. The wide-band matching circuit 68 is configured in the same manner as in the wide-band matching circuits 33a to 33d (refer to FIG. 4 to FIGS. 6A and 6B).

A transmission signal generated in the transmitter 651 is amplified by the PA module 30, passes through the variable filter circuit 67 and the terminals P63 and P61 of the circulator 64, and is supplied to the antenna 61. At this time, the reception band noise that has occurred in the final-stage amplifying element 11b (refer to FIG. 4) of the PA module 30 is attenuated by the variable filter circuit 67. A reception signal received with the antenna 61 passes through the terminals P61 and P62 of the circulator 64, is amplified by the low noise amplifier 66, and is supplied to the receiver 651.

In the fourth embodiment, as described above, the circulator 64 transmits the high-frequency signal with low loss in the wide frequency range including the multiple communication bands. In other words, the transmission loss between the antenna 61 and the RFIC 65 is reduced. In addition, the circulator 64 is smaller than the multiple duplexers provided for the respective communication bands. Furthermore, since the reception band noise output from the PA module 30 is small, the level of the reception band noise entering the terminal P62 of the circulator 64 from the terminal P63 thereof is suppressed. Accordingly, high isolation is ensured between transmission and reception even when the circulator 64 is used to demultiplex the transmission signal from the reception signal. Consequently, it is possible to realize the compact front end circuit having excellent communication characteristics in the multiple communication bands.

The wide-band matching circuit 68 performs matching between the variable filter circuit 67 side and the PA module 30 side in the wide frequency range including the multiple communication bands, as described above. This realizes the front end circuit 60 in which the attenuation of the high-frequency signal in the pass band is not higher than a desired level in the wide frequency range.

C1, C2 capacitor
L1 inductor
L2 inductor
P1, P2, P3 terminal
P61 terminal (first terminal)
P62 terminal (second terminal)
P63 terminal (third terminal)
VC1, VC2 variable capacitance element
VL1 variable inductor
10, 20, 30, 50 PA module (power amplification module)
11a amplifying element (first amplifying element)
11b amplifying element (second amplifying element)
12, 67 variable filter circuit
13, 23a, 23b matching circuit
33a to 33d, 41 to 45, 68 wide-band matching circuit
60 front end circuit
61 antenna
62 reception circuit
63 transmission circuit
64 circulator
65 RFIC
66 low noise amplifier
121a, 121b, 421 switch circuit
122a to 122c filter component
441a, 441b LC circuit
451a, 451b LC circuit
652, receiver
651, transmitter

The invention claimed is:

1. A power amplification module comprising:
a first power amplifying element;
a second power amplifying element; and
a first variable filter circuit connected between the first power amplifying element and the second power amplifying element,
wherein:
each of the first power amplifying element and the second power amplifying element is a multiband power amplifier;
a plurality of communication bands include a first communication band and a second communication band;
about a frequency, at least of one of a first reception band corresponding to the first communication band and a second reception band corresponding to the second communication band is disposed between a first transmission band corresponding to the first communication band and a second transmission band corresponding to the second communication band; and
the first variable filter circuit uses a transmission band corresponding to each used communication band selected from a plurality of communication bands as a pass band and a reception band corresponding to each communication band selected from the plurality of communication bands as an attenuation band.

2. The power amplification module according to claim 1, further comprising a matching circuit connected between the first variable filter circuit and at least one of the first power amplifying element and the second power amplifying element, wherein:
   the matching circuit varies a matching value of the matching circuit in accordance with a frequency of the used transmission band;
   the matching circuit has a plurality of matching circuits, and
   the matching circuit is connected between the first variable filter circuit and the first power amplifying element, and between the first variable filter circuit and the second power amplifying element.

3. The power amplification module according to claim 2, wherein the matching circuit has a variable reactance, and the variable reactance is integrally formed on a semiconductor chip with the first amplifying element and the second amplifying element.

4. The power amplification module according to claim 3, wherein the variable reactance is a variable capacitance element.

5. The power amplification module according to claim 3, wherein the variable reactance includes a plurality of reactances having values not varied and a switch circuit switching between the reactances.

6. The power amplification module according to claim 3, wherein the matching circuit performs temperature compensation by varying the variable reactance based on a measurement result by a temperature sensor.

7. The power amplification module according to claim 2, wherein an output terminal of the first amplifying element is connected to an input terminal of the first variable filter circuit,
   wherein an input terminal of the second amplifying element is connected to an output terminal of the first variable filter circuit, and
   wherein the matching circuit is connected at least one of between the output terminal of the first amplifying element and the input terminal of the first variable filter circuit and between the input terminal of the second amplifying element and the output terminal of the first variable filter circuit.

8. The power amplification module according to claim 7, wherein the matching circuit is connected between the output terminal of the first amplifying element and the first variable filter circuit and between the input terminal of the second amplifying element and the first variable filter circuit.

9. The power amplification module according to claim 7, wherein the matching circuit is connected to an input terminal side of the first amplifying element and an output terminal side of the second amplifying element.

10. The power amplification module according to claim 2, wherein the matching circuit is configured by cascade-connecting a circuit composed of a reactance connected in series and a reactance connected in parallel.

11. A front end circuit according to claim 10, further comprising:
    a second variable filter circuit connected between the circulator and the power amplification module; and
    a second matching circuit connected between the second variable filter circuit and the power amplification module.

12. The power amplification module according to claim 2, wherein the matching circuit is a wide-band matching circuit.

13. The power amplification module according to claim 1, further comprising
    a plurality of power amplifying elements, wherein the plurality of power amplifying elements include three or more amplifying elements including the first power amplifying element and the second power amplifying element, and
    the first variable filter circuit is connected between a final-stage power amplifying element of the plurality of power amplifying elements and an anterior power amplifying element connected next to the final-stage power amplifying element.

14. The power amplification module according to claim 1, wherein the pass band of the first variable filter circuit is narrowed down in accordance with an used transmission modulation band which is a part of each transmission band.

15. The power amplification module according to claim 1, wherein the first variable filter circuit uses only a used transmission modulation band, in the transmission band, as the pass band.

16. A front end circuit comprising:
    a circulator;
    a reception circuit; and
    a transmission circuit including the power amplification module according to claim 1.

17. The power amplification module according to claim 1, wherein the first variable filter circuit is a band pass filter.

18. The power amplification module according to claim 1, wherein the first variable filter circuit is a band elimination filter.

19. The power amplification module according to claim 1, wherein the first variable filter circuit uses only a used transmission modulation band, in the transmission band, as the pass band.

* * * * *